US010269601B2

(12) United States Patent
Na et al.

(10) Patent No.: US 10,269,601 B2
(45) Date of Patent: Apr. 23, 2019

(54) CHAMBER LEAK AND GAS CONTAIMINATION DETECTION

(71) Applicant: Applied Materials, Inc., Santa Clara, CA (US)

(72) Inventors: Shuo Julia Na, Sunnyvale, CA (US); Patrick L. Smith, Vancouver, WA (US); Ilias Iliopoulos, Foster City, CA (US); Songfu Jiang, Shenyang (CN); Bo Zhang, Suzhou (CN)

(73) Assignee: Applied Materials, Inc., Santa Clara, CA (US)

( * ) Notice: Subject to any disclaimer, the term of this patent is extended or adjusted under 35 U.S.C. 154(b) by 63 days.

(21) Appl. No.: 15/276,526

(22) Filed: Sep. 26, 2016

(65) Prior Publication Data

US 2017/0107610 A1 Apr. 20, 2017

Related U.S. Application Data

(60) Provisional application No. 62/244,056, filed on Oct. 20, 2015.

(51) Int. Cl.
*H01L 21/67* (2006.01)
*C23C 14/54* (2006.01)
*C23C 14/56* (2006.01)

(52) U.S. Cl.
CPC ........ *H01L 21/67253* (2013.01); *C23C 14/54* (2013.01); *C23C 14/564* (2013.01); *H01L 21/67288* (2013.01)

(58) Field of Classification Search
CPC ......... H01L 21/67253; H01L 21/67288; C23C 14/54; C23C 14/564
See application file for complete search history.

(56) References Cited

U.S. PATENT DOCUMENTS

| 2003/0207021 | A1* | 11/2003 | Izawa | C23C 16/4401 427/8 |
| 2008/0306615 | A1* | 12/2008 | Morisawa | C23C 16/52 700/18 |
| 2009/0229348 | A1* | 9/2009 | Woo | C23C 16/4401 73/40.5 R |
| 2011/0002546 | A1* | 1/2011 | Conger | G01N 21/3504 382/191 |
| 2013/0018500 | A1* | 1/2013 | Porthouse | G05D 16/2046 700/104 |

* cited by examiner

Primary Examiner — Matthew D Krcha
(74) Attorney, Agent, or Firm — Patterson + Sheridan, LLP

(57) ABSTRACT

Embodiments presented herein provide techniques for controlling deposition processes in a process chamber based on monitoring contaminant gas levels in a chamber. Embodiments include generating a data model defining acceptable levels within the chamber for each of a plurality of gas types. Gas levels of the plurality of gas types within the chamber are monitored using one or more sensor devices within the chamber. Upon determining that at least one gas level within the chamber violates the acceptable level for the respective gas type within the data model, embodiments perform a corrective action for the chamber.

16 Claims, 4 Drawing Sheets

CHAMBER LEAK AND GAS CONTAIMINATION DETECTION

CROSS-REFERENCE TO RELATED APPLICATIONS

This application claims benefit of U.S. Provisional Patent Application Ser. No. 62/244,056, entitled "Chamber Leak and Gas Contamination Detection," filed Oct. 20, 2015 and assigned to the assignee hereof, the contents of which are hereby incorporated by reference.

BACKGROUND

Field

Embodiments of the present disclosure generally relate to controlling process chambers, and more particularly to techniques for detecting gas leak contamination within a process chamber.

Description of the Related Art

Process chambers used in the production of, for example, semiconductors (e.g., computer processors, coprocessors, solid state storage, and the like) and display devices (e.g., thin film transistor screens, organic light emitting diode screens, and the like) generally establish a vacuum environment in order to deposit various materials on a substrate. Deposition processes, such as physical vapor deposition, may be affected by the presence of a small amount of contaminant gas in the chamber. For example, if an amount of residual gas exceeds a threshold amount, a vapor deposition process may result in depositing excess material on the substrate or depositing too little material on the substrate (both of which are referred to herein as an "out-of-specification substrate"). Both situations may result in wasted wafers or substrates, as an end product resulting from an out-of-specification substrate may not work at all or may exceed an acceptable number of faults.

To determine whether a gas leak is present in a process chamber, which may result in an elevated level of contaminant gases in the chamber, a system operator generally waits for completion of a deposition process on a substrate to test the substrate and determine if the substrate meets a specification for a particular process and/or product. For instance, a gas leak could develop within the chamber during a deposition process. If an amount of material deposited on the substrate falls outside the specification, the system operator can infer that a gas leak was present in the process chamber and attempt to rectify the gas leak. Additionally, gas leaks may develop in a process chamber while the process chamber is idle. When a gas leak develops while the process chamber is idle, a system operator may not detect such a problem until deposition processes are restarted and produced wafers or substrates can be tested against a specification for a particular product. However, such processes result in wasted materials and chamber production time.

SUMMARY

One embodiment provides a method for controlling deposition processes in a chamber. The method includes generating a data model defining acceptable levels within the chamber for each of a plurality of gas types. Additionally, the method includes monitoring, using one or more sensor devices within the chamber, gas levels of the plurality of gas types within the chamber. The method also includes, upon determining that at least one gas level within the chamber violates the acceptable level for the respective gas type within the data model, performing a corrective action, comprising at least one of: (i) taking one or more actions to halt deposition processes; and (ii) generating an alert indicating a possible gas leak event in the chamber.

Additional embodiments provide a system and non-transitory computer-readable medium containing computer program code that, when executed, performs an operation to carry out the aforementioned method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
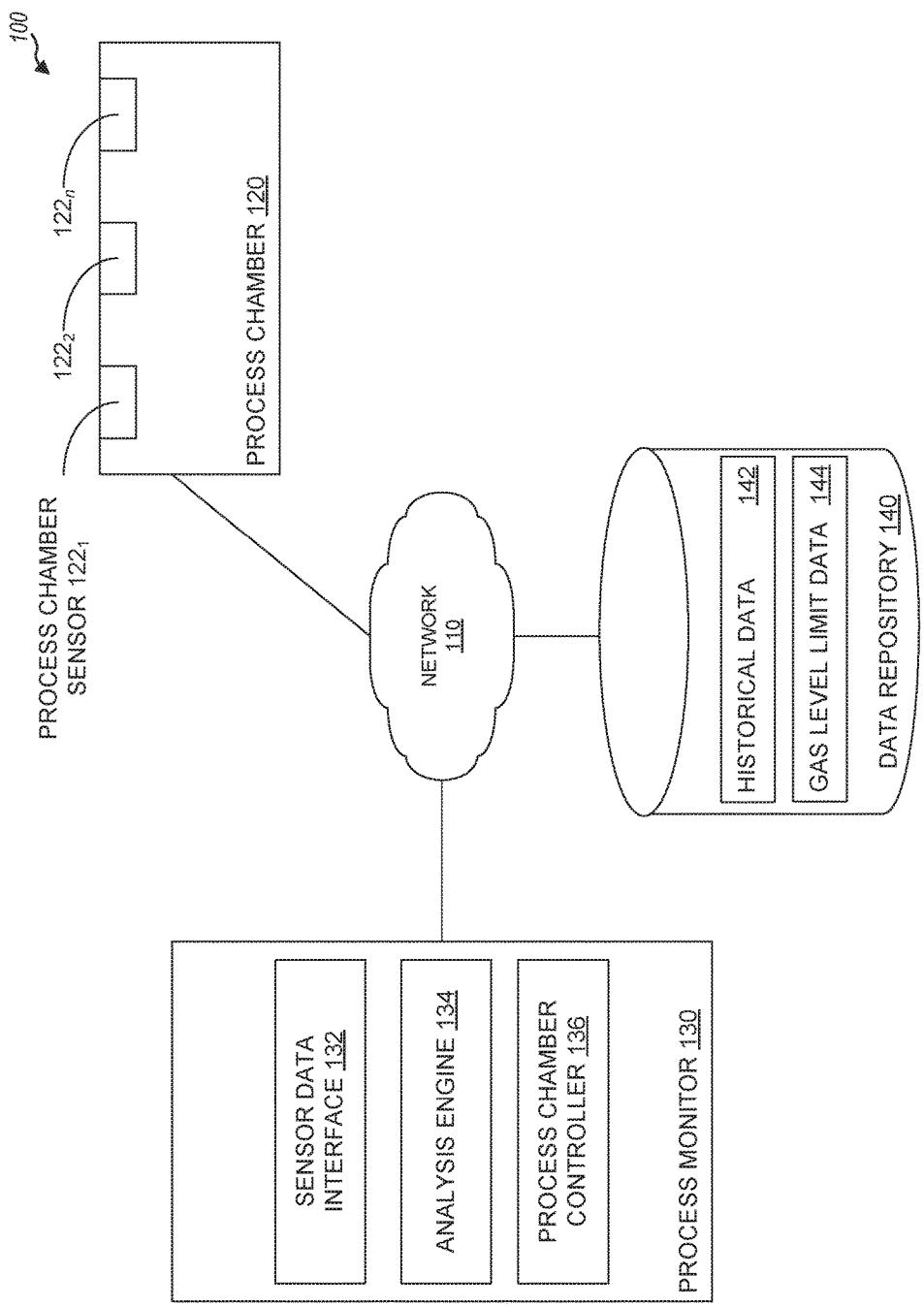
FIG. 1 illustrates a computer system for monitoring residual gas levels in a process chamber, according to one embodiment.

To facilitate understanding, identical reference numerals have been used, wherever possible, to designate identical elements that are common to the Figures. Additionally, it is contemplated that elements disclosed in one embodiment may be beneficially used in other embodiments described herein without specific recitation.

DETAILED DESCRIPTION

Embodiments presented herein allow for continual monitoring of residual gas levels in a process chamber to detect potential gas leak events in the process chamber and interdict in the operation of the process chamber (e.g., pausing an in-progress vapor deposition process or preventing a new vapor deposition process from executing) when a potential gas leak event is detected. By interdicting in the operations of a process chamber in response to detecting a potential gas leak event, the system may allow for such events to be rectified before a process creates an out-of-specification product that may not be usable as an end product. Doing so can increase process yield of the process chamber by reducing the number of wafers or substrates that need to be discarded.

In some embodiments, a monitoring system continually monitors the residual gas levels in the process chamber using one or more sensor devices within the process chamber. When the monitoring system detects a potential gas leak event, the monitoring system may generate a user alert notifying a user of the detected event and could receive user input indicating whether the potential gas leak event was, in fact, a gas leak. For instance, the monitoring system could maintain threshold levels (e.g., minimum and/or maximum levels) for each of a plurality of different types of gases, and could compare the measured levels for the various types of gases to the threshold levels to determine when a residual gas has reached an unacceptable level within the chamber. The monitoring system can be configured to refine these threshold levels over time, e.g., using a machine learning algorithm. For instance, the monitoring system could increase an allowable gas level if the event was tagged as a false positive or decrease the allowable gas level if the event was tagged as an actual gas leak event. As additional events are detected, resolved, and flagged, the system can fine-tune the allowable gas levels to minimize an amount of false positives while detecting substantially all actual gas leak events in the process chamber.

FIG. 1 illustrates an example computer system 100 in which a process monitor monitors levels of residual gases in a process chamber and interdicts in the operation of the process chamber based on a comparison between a monitored level of a residual gas and an allowable level, according to one embodiment. As illustrated, computer system 100 includes a process chamber 120, a process monitor 130, and a data repository 140, connected via network 110. While process monitor 130 and data repository 140 are illustrated in FIG. 1 as separate machines connected to network 110, process monitor 130 and data repository 140, in some cases, may be hosted on the same machine.

Process chamber 120 generally is a chamber in which semiconductor substrates are processed. Process chamber 120 may be, for example, a vacuum chamber used for physical vapor deposition (PVD), where a target of conducting material is heated (e.g., through energy bombardment) or sputtered (e.g., using a magnetic field to attract ionized materials onto a substrate) to create a vapor layer of the material for deposition on a substrate. The deposited material may be used to create the conducting circuitry on an integrated circuit or a flat panel display. The target may be a material chosen for a particular process, such as aluminum or titanium nitride.

Process chamber 120 may include one or more process chamber sensors 122. Process chamber sensors 122 may be connected to network 110 and transmit data to a process controller using an appropriate communications protocol, such as MODBUS or PROFIBUS for control of a process chamber on a local network, or SECS/GEM (Semi Equipment Communication Standard/Generic Equipment Module) communications common to a fabrication system. The gas level sensors 122 may monitor a variety of gases in process chamber 122, including, for example, $H_2O$, $N_2$, $O_2$, $CO_2$, or other gases that increase film resistivity as gas concentration in process chamber 120 increases.

Process monitor 130 generally monitors the status of process chamber 120 and determines when to pause a currently running process or prevent a new process from executing in a process chamber 120 based on the monitored data. As illustrated, process monitor 130 generally includes a sensor data interface 132, analysis engine 134, and process chamber controller 136.

Sensor data interface 132 may be configured to poll the process chamber sensors 122 in a process chamber 120 for information about levels of residual gases in the chamber on a regular basis. For example, sensor data interface 132 could poll the process chamber sensors 122 every second. In another embodiment, sensor data interface 132 may be configured to poll individual process chamber sensors 122 on different schedules based on the data monitored by a particular process chamber sensor 122. To poll a sensor 122 for data, sensor data interface 132 may transmit a "read" command to the sensor; in response, the polled sensor 122 may transmit data to sensor data interface 132 for further processing. In some cases, a sensor may transmit a raw value (e.g., voltage) to sensor data interface 132, and sensor data interface 132 or analysis engine 134 may be configured to convert the raw value to usable data (e.g., a concentration of a particular gas in process chamber 120).

Analysis engine 134 generally receives data from sensor data interface 132 and uses the received data to determine whether a residual gas(es) within the process chamber 120 have reached unacceptable level(s). To determine whether a gas leak may have occurred in process chamber 120, analysis engine 134 can receive data, via sensor data interface 132, specifying an amount of a particular gas in process chamber 120. In some cases, analysis engine 134 may use a single measured residual gas value to determine whether a gas leak event may have occurred; in other cases, analysis engine 134 may use a running average of measured values to determine whether a gas leak event may have occurred. For instance, in such an embodiment, the analysis engine 134 could compare the running average of measured residual gas values over a period of time with predefined threshold information describing unacceptable levels and trends of residual gases within the chamber. Additionally, the analysis engine 134 could consider the trend of the measured residual gas values within the chamber in detecting whether a gas leak event has occurred, e.g., if the measured gas levels have been trending, over time, towards exceeding the threshold amount of the gas and will reach the threshold amount of gas within a predefined amount of time.

After obtaining residual gas level information from sensors 122 via sensor data interface 132, analysis engine 134 can compare the measured residual gas levels to a data model describing acceptable levels of residual gases within the chamber. For instance, such a data model could be defined in a database or data store (e.g., gas level limit data 144 in a data repository 140). The data model could specify different acceptable gas levels for each of the types of residual gases based on whether process chamber 120 is active (i.e., is performing deposition operations on a substrate) or inactive. Additionally, where the process chamber is active, the data model could specify differing thresholds of the residual gases for each of a plurality of different types of processes being performed in process chamber 120. For example, while process chamber 120 is idle, one set of acceptable gas levels may be used. When process chamber 120 performs deposition operations according to a particular recipe that defines the materials to be deposited on a substrate, an amount of each material to be deposited, and so on, different sets of acceptable gas levels may be used. For instance, a particular level of a particular type of gas may be acceptable within the process chamber for a certain type of deposition operation, but may be unacceptable for another type of deposition operation, and such differences can be reflected within the data model used by the analysis engine 134 to detect gas leak events within the process chamber.

If analysis engine 134 determines that a potential gas leak event has occurred in the process chamber 120, analysis engine 134 can log the event in a data store (e.g., historical data 142 in data repository 140) and trigger an alert. The alert may be displayed on a screen associated with process monitor 130, sent to a designated system operator via e-mail or SMS, or otherwise conveyed to a system operator. Analysis engine 134 may also set a flag in process monitor 130 to instruct process chamber controller 136 to interdict in operating the process chamber 120, e.g., by preventing new deposition operations from being initiated (if the chamber is idle when the gas leak event is detected) or pausing a current deposition operation (if the chamber is active when the gas leak event is detected). The alert may request that a system operator confirm whether the detected gas leak event was, in fact, a gas leak event, or was a false positive.

Additionally, the analysis engine 134 can provide a user interface through which the system operator can provide feedback for a detected gas leak event. For instance, the analysis engine 134 could enable the system operator to confirm whether a detected gas leak event was in fact a gas leak within the chamber or whether the detected gas leak was a false positive. In response to user feedback regarding whether the detected gas leak event was an actual gas leak event or a false positive, analysis engine 134 may adjust the various thresholds for the residual gases within the data model for use in future monitoring operations. For instance, if a system operator indicates that a detected gas leak event was a false positive, the gas level limit may be adjusted to require a higher detected amount of gas to trigger detection of a gas leak event. Conversely, if a system operator flags a gas leak event as an actual gas leak event and the measured gas level is within a set amount from the acceptable gas level (defined, as discussed above, in a particular recipe), analysis engine 134 may adjust the gas level limit to require a lower amount of residual gas in process chamber 120 to trigger a gas leak event.

Process chamber controller 136 generally controls operations at process chamber 120 based on residual gas analysis performed by analysis engine 134. As discussed above, if a gas leak event is detected, process chamber controller 136 can perform operations to minimize a number of wasted substrates until a system operator has processed the gas leak event (e.g., by correcting the gas leak, by indicating that the gas leak event was a false positive, etc.). For example, if process chamber 120 is idle, process chamber controller 136 may block a system operator from beginning any deposition processes in process chamber 120 until the gas leak event is resolved. If process chamber 120 is not idle, process chamber controller 136 may pause deposition processes in process chamber 120 until the gas leak event is resolved.

Generally, data repository 140 stores information about the process chamber 120 and operations of the process chamber 120. Data repository 140 includes historical data 142 and gas level limit data 144. In one embodiment, data repository 140 represents a relational database. Data repository 140 may be stored on any suitable storage medium, including (but not limited to) a storage array of hard disks, solid state drives, or other appropriate storage medium.

Historical data 142 may include information about each detected potential gas leak event, including the process executing when the gas leak was detected and the judgment of a system operator as to whether the potential gas loss event constituted an actual gas loss event. In some embodiments, the process monitor 130 is configured to query the historical data 142 to generate a report, for example, of how often a gas leak was detected in process chamber 120 and how often the reported gas leak events were, in fact, gas leak events.

Gas level limit data 144, as described briefly above, may define an acceptable level of a particular residual gas for a particular process. To allow process monitor 130 to monitor for potential gas leak events while process chamber 120 is idle, a set of idle gas level limits may be defined and used by process monitor 130. As process monitor 130 detect and processes additional gas leak events, gas level limit data for a particular process may be adjusted to allow more gas in process chamber 120 (i.e., if a system operator determines that there is no gas leak in the system). In some cases, a gas level limit may be defined for when process chamber 120 is idle.

Figure 2:
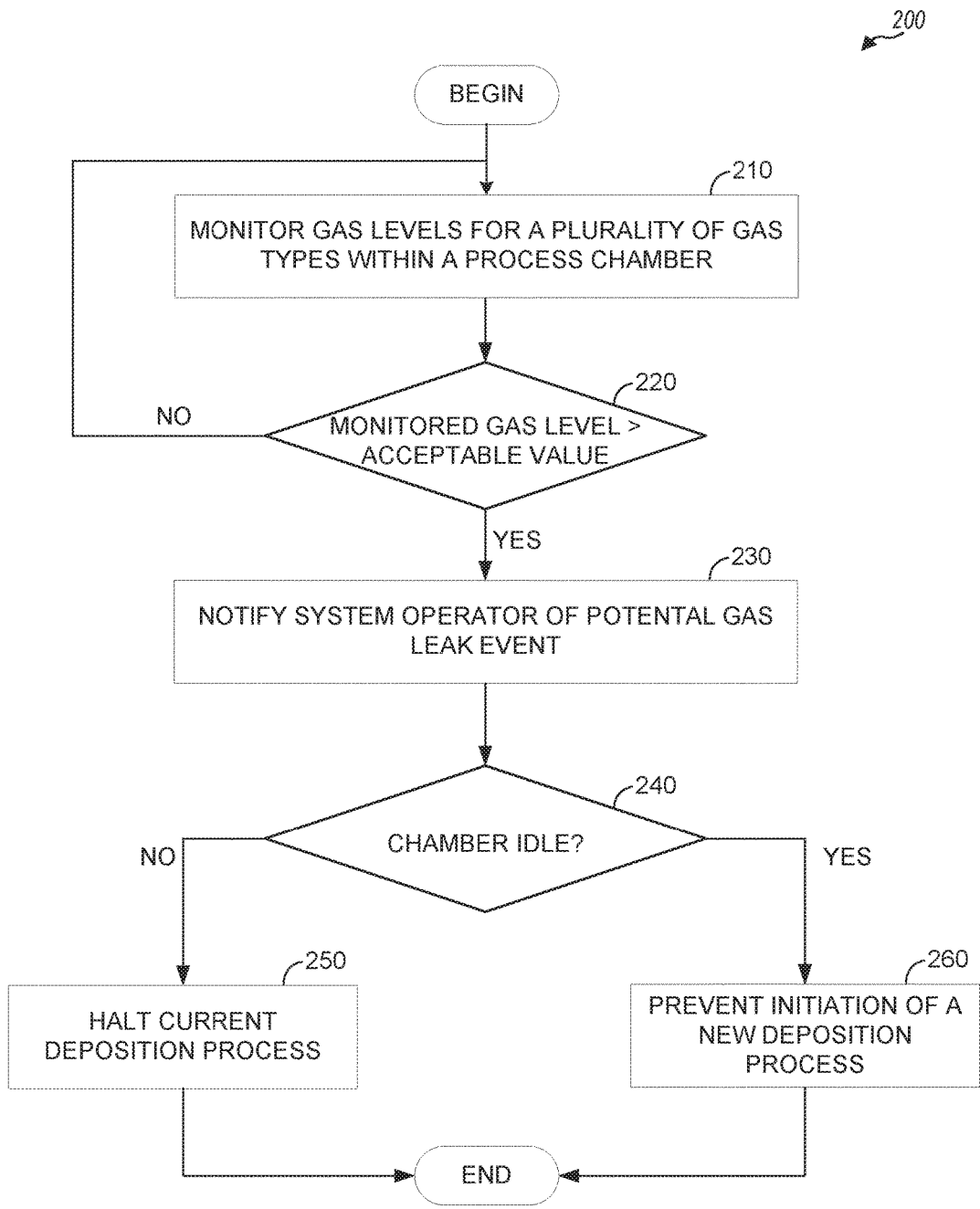
FIG. 2 is a flow diagram illustrating a method of monitoring for potential gas leak events in a process chamber and interdict in the operations of the process chamber, according to one embodiment.

FIG. 2 is a flow diagram illustrating a method of determining a potential gas leak has occurred, according to one embodiment. The method 200 begins at block 210, where the process monitor 130 monitors gas levels for a plurality of gas types (e.g., $H_2O$, $N_2$, $O_2$, $CO_2$, etc.) within a process chamber using process chamber sensors $122_{1-N}$. As discussed above, the process monitor 130 may repeatedly query the process chamber sensors $122_{1-N}$ on a regular interval for each type of gas to be monitored in the process chamber.

At block 220, the process monitor 130 compares the monitored gas level to an acceptable gas level defined within a data model. As discussed above, the acceptable gas level may be obtained from a recipe for a particular process being executed in the process chamber (including an idle recipe for when the process chamber is not performing any deposition processes). The monitored gas level may be an instantaneous gas level or a moving average over an amount of time. If the monitored gas level is less than the acceptable value, the method 200 returns to block 210, where the process monitor 130 continues to monitor the gas levels within the process chamber. Otherwise, if process monitor 130 determines that the monitored gas level exceeds the acceptable value specified by the data model, the method proceeds to block 230, where the process monitor 130 notifies a system operator that a potential gas leak event was detected in a process chamber. As discussed above, the process monitor can generate an alert to be displayed on a display connected to the process monitor, send an e-mail or SMS to a system operator, and so on.

While the method 200 relates to detecting whether a measured level of residual gas within the process chamber exceeds a threshold amount of the residual gas, the process monitor 130 can also be configured to determine whether the measured level of gas is less than a minimum acceptable amount of the residual gas within the chamber. For instance, in such an embodiment, the data model can specify a range of residual gas amounts that are acceptable within the process chamber, and the process monitor 130 can monitor the residual gas levels within the process chamber to detect when the residual gas levels reach an unacceptable level.

At block 240, the process monitor 130 determines if the process chamber is currently idle. If not, the process monitor 130 halts a current deposition process within the process chamber (block 250). If the process monitor 130 determines that the process chamber is currently idle, the process monitor prevents the initiation of a new deposition process (block 260). In both cases, the process monitor 130 can lock the process chamber until a system operator unlocks the process chamber and indicates that the gas leak event was either a false positive or rectified.

Figure 3:
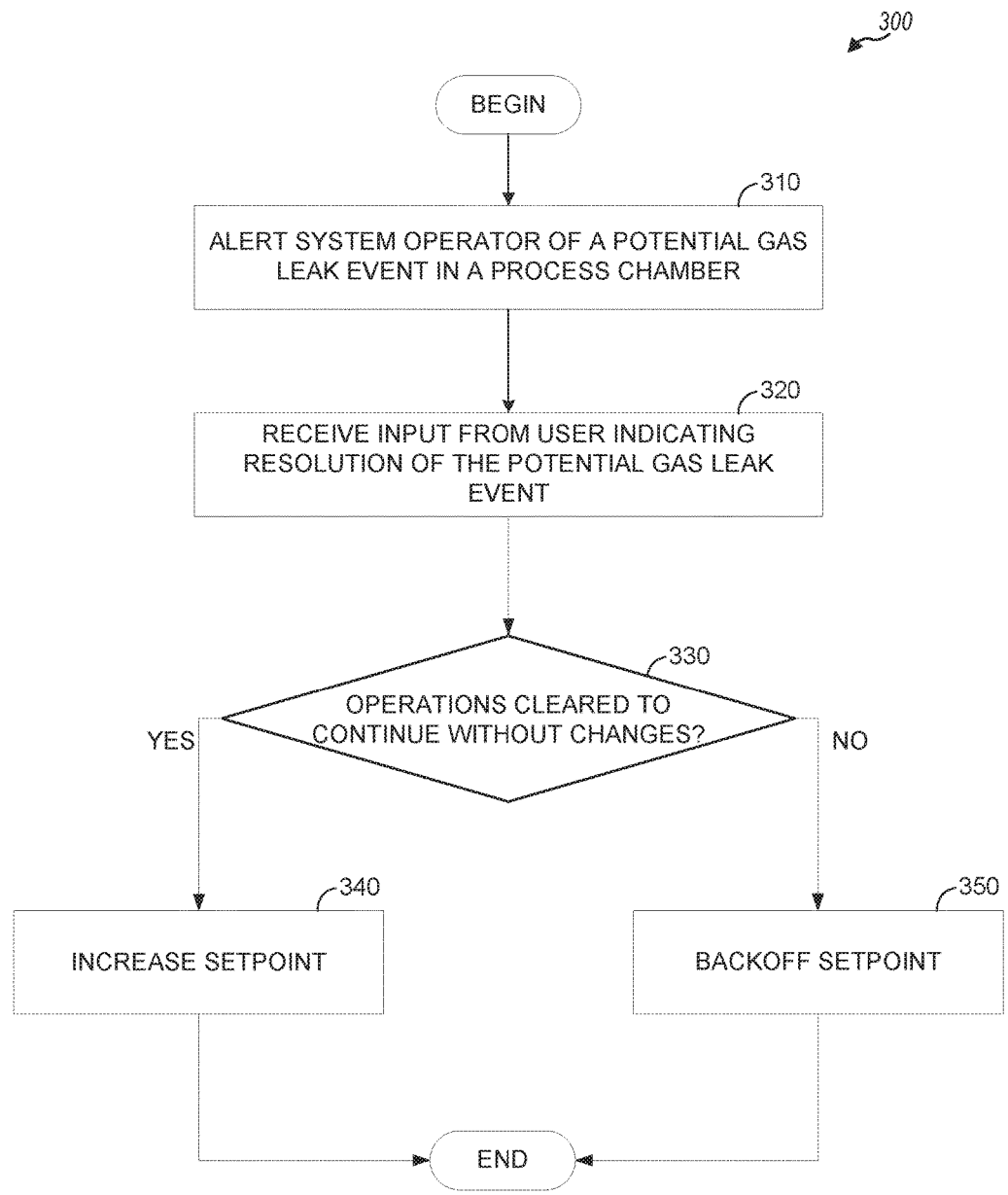
FIG. 3 is a flow diagram illustrating a method of adjusting an acceptable level of residual gases in a process chamber, according to one embodiment.

FIG. 3 is a flow diagram illustrating a method for adjusting acceptable gas levels within a data model based on system operator feedback, according to one embodiment. As illustrated, the method 300 begins at block 310, where the process monitor 130 alerts a system operator of a potential gas leak event in a process chamber. At block 320, the process monitor receives feedback from a system operator in response to the alert.

At block 330, the process monitor 130 determines whether operations were cleared to continue without performing any changes to the process chamber. If so, the method 300 proceeds to block 340, where the process monitor 130 increases an acceptable gas level. The process monitor 130 may increase an acceptable gas level for the residual gas within the data model by a preset amount such that the potential gas leak event would not trigger detection of a potential gas leak event in the future. Otherwise, if process monitor 130 determines that operations were cleared to continue after rectifying a gas leak at the process chamber, the method 300 proceeds to block 350, where the process monitor 130 decreases the acceptable gas level for the residual gas within the data model. In one embodiment, the process monitor 130 is configured to update the threshold amount of gas only in the event of a false positive or in the event that a user specifies (e.g., using a graphical user interface provided by the process monitor 130) that a gas leak went undetected. By continually updating the acceptable gas levels for the residual gases within the process chamber, the process monitor 130 can more accurately detect future potential gas leaks.

Figure 4:
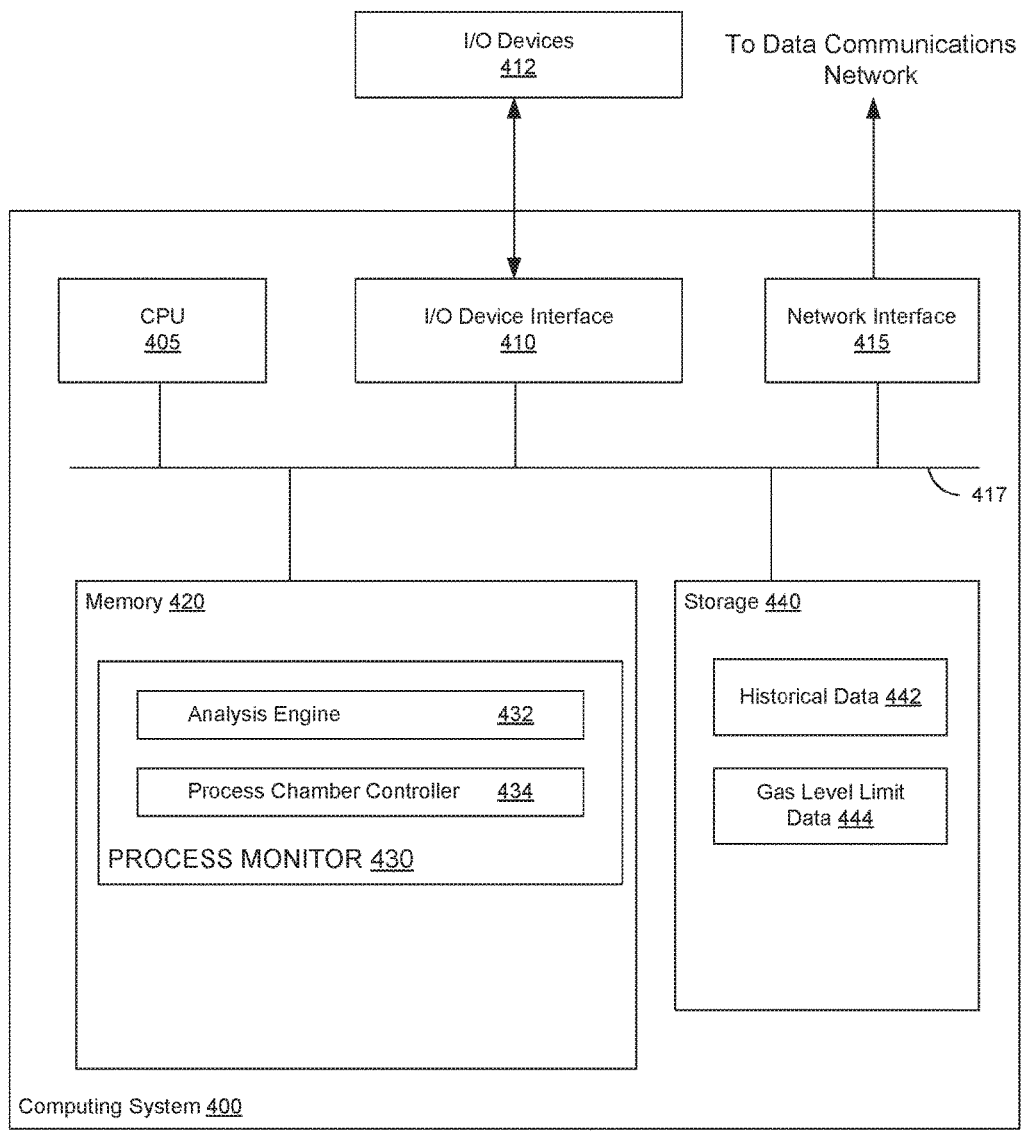
FIG. 4 illustrates an example computing system configured with a process monitor, according to one embodiment.

FIG. 4 illustrates a computing system with a process monitor, according to one embodiment. As shown the computing system 400 includes, without limitation, a central processing unit (CPU) 405, a network interface 415, a memory 420, and storage 440, each connected to a bus 417. The computing system 400 may also include an I/O device interface 410 connecting I/O devices 412 (e.g., keyboard, mouse, and display devices) to the computing system 400. Further, in context of this disclosure, the computing elements shown in the computing system 400 may correspond to a physical computing system (e.g., a system in a data center) or may be a virtual computing instance executing within a computing cloud.

The CPU 405 retrieves and executes programming instructions stored in the memory 420 as well as stores and retrieves application data residing in the memory 420. The bus 417 is used to transmit programming instructions and application data between CPU 405, I/O device interface 410, storage 440, network interface 415, and memory 420. Note, CPU 405 is included to be representative of a single CPU, multiple CPUs, a single CPU having multiple processing cores, and the like. Memory 420 is generally included to be representative of a random access memory. Storage 440 may be a disk drive storage device. Although shown as a single unit, storage 440 may be a combination of fixed and/or removable storage devices, such as fixed disc drives, removable memory cards, or optical storage, network attached storage (NAS), or a storage area-network (SAN).

Illustratively, the memory 420 includes process monitor 130, which includes analysis engine 134 and process chamber controller 136. As discussed above, analysis engine 134 queries one or more residual gas sensors in a process chamber via I/O device interface 410 (if computing system 400 is directly connected to a process chamber via, e.g., a USB interface) or network interface 415 (if computing system 400 is connected to a process chamber via Ethernet or remotely through a data communications network or the Internet). As analysis engine 134 receives data from the one or more sensors, analysis engine 134 can determine whether a potential gas leak event exists based on a comparison between a monitored gas level and a gas level limit (e.g., according to a recipe for a current process operating in the process chamber). When analysis engine 134 detects a potential gas leak event, analysis engine 134 can set a flag that indicates that a potential gas leak event has been detected at the process chamber. Additionally, based on user feedback, analysis engine 134 can adjust acceptable gas levels to avoid future false positives or detect gas leak events earlier.

Process chamber controller 136, as discussed above, can use detected potential gas leak events to interdict in the operations of a process chamber. If analysis engine 134 detects a potential gas leak event and the process chamber is idle, process chamber controller 136 can lock the process chamber from initiating any deposition operations until a system operator clears the gas leak event and indicates whether the event was an actual gas leak event or a false positive. If analysis engine 134 detects a potential gas leak event and the process chamber is active, process chamber controller 136 can pause deposition processes operating in process chamber 120 until a system operator clears the gas leak event and indicates whether the event was an actual gas leak event or a false positive.

Storage 440 may be a hard drive, solid state drive, networked storage, or other storage medium on which data used by process monitor 130 may be stored. As illustrated, storage 440 includes historical data 142 and gas level limit data 144. Historical data 142 may be used to log potential gas leak events and information about how the gas leak events were resolved (i.e., marked as an actual gas leak or a false positive). Gas level limit data 144, as discussed above, may define an acceptable level of residual gases for a particular process (including an "idle" process defined for when the process chamber is idle). As analysis engine 134 receives feedback about detected gas leak events, one or more gas level limits in gas level limit data 144 may be adjusted to reduce an incidence of false positives or detect gas leak events earlier.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, C#, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, executed in parallel, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. A method for controlling deposition processes in a chamber, comprising:
   generating a data model defining acceptable residual gas levels of each of a plurality of gas types within the chamber,
   wherein the data model defines respective acceptable residual gas levels for each of the plurality of gas types within the chamber for each of a plurality of deposition processes performed within the chamber;
   monitoring, using one or more sensor devices within the chamber, residual gas levels of the plurality of gas types within the chamber over a period of time; and
   responsive to determining that at least one residual gas level within the chamber has been trending, over time, towards exceeding the acceptable residual gas level for the respective gas type for a specified deposition process being performed within the chamber within the data model and exceeding the acceptable residual gas level within a predefined amount of time, performing corrective actions, comprising:
   generating an alert indicating a possible gas leak event in the chamber, and
   halting a deposition process that is currently in progress, if the chamber is active, or
   preventing a new deposition process from being initiated, if the chamber is idle.

2. The method of claim 1, wherein the data model further defines acceptable residual gas levels for each of the plurality of gas types within the chamber for when the chamber is idle.

3. The method of claim 1, further comprising:
   receiving, in response to the alert, an indication that the event was an actual gas leak; and
   adjusting at least one of the one or more acceptable residual gas levels to trigger a subsequent alert based on a lesser monitored residual gas level.

4. The method of claim 1, further comprising:
   receiving, in response to the alert, an indication that the event was a false positive; and
   adjusting at least one of the one or more acceptable residual gas levels to trigger a subsequent alert based on a different monitored gas level.

5. The method of claim 4, further comprising:
   if chamber was active when the alert was generated, resuming the deposition processes.

6. The method of claim 1, wherein the plurality of gas types include at least one of: $H_2O$ vapor, $N_2$, $O_2$, or $CO_2$.

7. The method of claim 1, wherein the monitored residual gas level comprises a moving average of monitored residual gas levels over a period of time.

8. A system, comprising:
one or more computer processors;
a process chamber;
one or more sensor devices within the process chamber; and
a memory containing computer program code that, when executed by operation of the one or more computer processors, performs an operation for controlling deposition processes in the process chamber, the operation comprising:
generating a data model defining acceptable residual gas levels of each of a plurality of gas types within the process chamber,
wherein the data model defines respective acceptable residual gas levels for each of the plurality of gas types within the process chamber for each of a plurality of deposition processes performed within the chamber;
monitoring, using the one or more sensor devices within the process chamber, residual gas levels of the plurality of gas types within the process chamber over a period of time; and
responsive to determining that at least one residual gas level within the process chamber has been trending, over time, towards exceeding the acceptable residual gas level for the respective gas type for a specified deposition process being performed within the process chamber within the data model and exceeding the acceptable residual gas level within a predefined amount of time, performing corrective actions, comprising:
generating an alert indicating a possible gas leak event in the process chamber, and
halting a deposition process that is currently in progress, if the process chamber is active, or
preventing a new deposition process from being initiated, if the process chamber is idle.

9. The system of claim 8, wherein the data model further defines acceptable residual gas levels for each of the plurality of gas types within the process chamber for when the process chamber is idle.

10. The system of claim 8, the operation further comprising:
receiving, in response to the alert, an indication that the event was an actual gas leak; and
adjusting at least one of the one or more acceptable residual gas levels to trigger a subsequent alert based on a lesser monitored residual gas level.

11. The system of claim 8, the operation further comprising:
receiving, in response to the alert, an indication that the event was a false positive; and
adjusting at least one of the one or more acceptable residual gas levels to trigger a subsequent alert based on a higher monitored residual gas level.

12. The system of claim 11, the operation further comprising:
if the process chamber was active when the alert was generated, resuming the deposition processes.

13. The system of claim 8, wherein the plurality of gas types include at least one of: $H_2O$ vapor, $N_2$, $O_2$, or $CO_2$.

14. The system of claim 8, wherein the monitored residual gas level comprises a moving average of monitored residual gas levels over a period of time.

15. A non-transitory computer-readable medium containing computer program code that, when executed by operation of one or more computer processors, performs an operation for controlling deposition processes in a chamber, comprising:
generating a data model defining acceptable residual gas levels of each of a plurality of gas types within the chamber,
wherein the data model defines respective acceptable residual gas levels for each of the plurality of gas types within the chamber for each of a plurality of deposition processes performed within the chamber;
monitoring, using one or more sensor devices within the chamber, residual gas levels of the plurality of gas types within the chamber over a period of time; and
responsive to determining that at least one residual gas level within the chamber has been trending, over time, towards exceeding the acceptable residual gas level for the respective gas type for a specified deposition process being performed within the chamber within the data model and exceeding the acceptable residual gas level within a predefined amount of time, performing corrective actions, comprising:
generating an alert indicating a possible gas leak event in the chamber, and
halting a deposition process that is currently in progress, if the chamber is active, or
preventing a new deposition process from being initiated, if the chamber is idle.

16. The non-transitory computer-readable medium of claim 15, wherein the data model further defines respective acceptable residual gas levels for each of the plurality of gas types within the chamber for each of a plurality of deposition processes performed within the chamber, and wherein the data model further defines acceptable residual gas levels for each of the plurality of gas types within the chamber for when the chamber is idle.

* * * * *